US011495588B2

(12) United States Patent
Bhagavat et al.

(10) Patent No.: US 11,495,588 B2
(45) Date of Patent: Nov. 8, 2022

(54) CIRCUIT BOARD WITH COMPACT PASSIVE COMPONENT ARRANGEMENT

(71) Applicant: ADVANCED MICRO DEVICES, INC., Santa Clara, CA (US)

(72) Inventors: Milind Bhagavat, Los Altos, CA (US); Rahul Agarwal, Livermore, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 328 days.

(21) Appl. No.: 16/213,347

(22) Filed: Dec. 7, 2018

(65) Prior Publication Data

US 2020/0185366 A1  Jun. 11, 2020

(51) Int. Cl.

| | | |
|---|---|---|
| *H01L 25/00* | (2006.01) | |
| *H01L 25/16* | (2006.01) | |
| *H01L 21/56* | (2006.01) | |
| *H01L 23/498* | (2006.01) | |
| *H05K 1/02* | (2006.01) | |
| *H05K 3/30* | (2006.01) | |
| *H05K 3/34* | (2006.01) | |
| *H05K 3/28* | (2006.01) | |

(52) U.S. Cl.
CPC ............ *H01L 25/16* (2013.01); *H01L 21/561* (2013.01); *H01L 21/565* (2013.01); *H01L 21/568* (2013.01); *H01L 23/49838* (2013.01); *H05K 1/0231* (2013.01); *H05K 3/284* (2013.01); *H05K 3/303* (2013.01); *H05K 3/3442* (2013.01); *H05K 2201/10015* (2013.01); *H05K 2201/10522* (2013.01); *H05K 2201/10636* (2013.01)

(58) Field of Classification Search
CPC ..... H01L 25/16; H01L 21/561; H01L 21/565; H01L 21/568; H01L 23/49838; H05K 1/0231; H05K 3/303; H05K 2201/10015; H05K 2201/10522; H05K 2201/10636
See application file for complete search history.

(56) References Cited

U.S. PATENT DOCUMENTS

| | | | |
|---|---|---|---|
| 6,404,649 | B1 | 6/2002 | Drake et al. |
| 7,123,465 | B2 | 10/2006 | Crane, Jr. et al. |
| 7,463,492 | B2 | 12/2008 | Radhakrishnan |
| 9,607,935 | B2 | 3/2017 | Martinez et al. |
| 2003/0218235 | A1 | 11/2003 | Searls et al. |
| 2004/0256133 | A1 | 12/2004 | Dishongh et al. |

(Continued)

FOREIGN PATENT DOCUMENTS

JP  2005150383  6/2005

OTHER PUBLICATIONS

PCT/US2019/058459 International Search Report and Written Opinion dated Feb. 17, 2020.

(Continued)

*Primary Examiner* — Pete T Lee

(57) ABSTRACT

Various circuit boards with mounted passive components and method of making the same are disclosed. In one aspect, a method of manufacturing is provided that includes at least partially encapsulating a first plurality of passive components in a molding material to create a first molded passive component group. The first molded passive component group is mounted on a surface of a circuit board. The first plurality of passive components are electrically connected to the circuit board.

19 Claims, 11 Drawing Sheets

(56) References Cited

U.S. PATENT DOCUMENTS

| | | |
|---|---|---|
| 2006/0158863 A1 | 7/2006 | Hsu |
| 2008/0055873 A1 | 3/2008 | Mi et al. |
| 2012/0314511 A1* | 12/2012 | Ishikawa ............ G01R 31/2884 365/189.05 |
| 2013/0337608 A1* | 12/2013 | Kotani .................... H01L 24/20 438/110 |
| 2014/0035630 A1 | 2/2014 | O'Donnell et al. |
| 2014/0097535 A1* | 4/2014 | He ......................... H01L 25/50 257/738 |
| 2014/0185248 A1* | 7/2014 | Mizushiro ............... H01L 23/48 361/728 |
| 2014/0346671 A1* | 11/2014 | Yu ........................... H01L 21/78 257/737 |
| 2015/0070864 A1* | 3/2015 | Rainer ................. H05K 1/0393 438/126 |
| 2016/0343635 A1* | 11/2016 | Rae .................... H01L 21/4846 |
| 2017/0064837 A1* | 3/2017 | Li .......................... H05K 1/113 |
| 2017/0125332 A1 | 5/2017 | Song et al. |
| 2017/0148744 A1 | 5/2017 | Carson et al. |
| 2018/0197755 A1 | 7/2018 | Hsu et al. |
| 2018/0204827 A1* | 7/2018 | Betsui ..................... H01L 22/14 |
| 2018/0323170 A1* | 11/2018 | Kim .................... H01L 23/3128 |
| 2018/0337135 A1* | 11/2018 | Yoshihiro ............... H01L 24/81 |
| 2020/0035606 A1* | 1/2020 | Bhagavat ............ H01L 25/0655 |

OTHER PUBLICATIONS

Murata Manufacturing Co., Ltd.; *Chip Monolithic Ceramic Capacitors*; Cat. No. CO2E-14; http://www.murata.com/; Sep. 1, 2008; pp. 1-155.

Murata Manufacturing Co., Ltd.; *Monolithic Ceramic Capacitor GRM0222C1A Series*; http://www.murata.com/archives/200810grm0222c1a-series.html; Sep. 2008; p. 1.

Yusuke Goto; *Murata's Capacitors Zero in on Increasing Frequency, Reducing Loss*; AEI Sep. 2007; 2007; pp. 41-44.

Kiyoyuki Nakagawa; *Needs for 01005-Style Parts Drive Mounting, Packaging Gains*; AEI Mar. 2007; 2007; pp. 37-38 and 53.

Extended European Search Report, EP19893860.7, dated Jul. 25, 2022, 10 pages.

* cited by examiner

CIRCUIT BOARD WITH COMPACT PASSIVE COMPONENT ARRANGEMENT

BACKGROUND OF THE INVENTION

All integrated circuits require electrical power to operate, and packaged integrated circuits are no exception. Power is normally delivered to integrated circuits via a power supply and some form of power delivery network. Although currently-available power supplies are designed to supply stable voltages, the actual power delivered to integrated circuits can contain significant amounts of noise. There are many sources of noise, such as voltage fluctuations caused by other devices coupled to the power supply, electromagnetic interference and other causes.

Conventional packaged integrated circuits typically include a semiconductor chip mounted on a carrier substrate. The carrier substrate is configured to mount to a printed circuit board, such as a motherboard or card. The typical conventional carrier substrate includes an interconnect system that is made up of multiple layers of conductor planes or traces tied vertically by plural vias. Input/output pads on the die side of the carrier substrate connect to the die and input/output pads on the underside of the carrier substrate connect to the printed circuit board. A ball grid array, a land grid array or pin grid array is used to electrically connect the underside input/output pads to the printed circuit board.

To address issues associated with power supply noise, conventional semiconductor chip packages use decoupling capacitors. Many of these decoupling capacitors are mounted to the carrier substrate. In one conventional variant, the decoupling capacitors are mounted to the die side of the carrier substrate around the periphery of the die. In another conventional variant, the decoupling capacitors are mounted to the underside of the carrier substrate.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
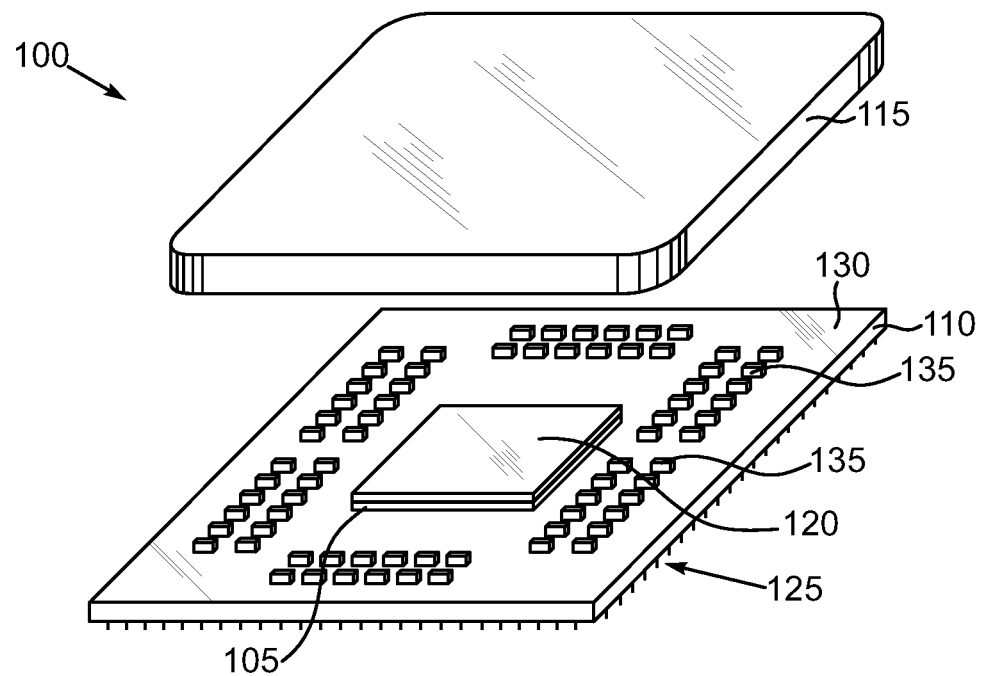
FIG. 1 is a partially exploded pictorial view of an exemplary conventional semiconductor chip package.

Decoupling capacitors are conventionally mounted one at a time to the surface of a semiconductor chip package substrate. Each capacitor is positioned with electrodes vertically aligned with an underlying solder structure of the package substrate. A reflow is performed to temporarily liquefy the solder structures. A cool down solidifies the solder structures and makes the electrical and mechanical connections between the capacitors and the package substrate. The mounting process involves a pick and place operation. There is the chance that imperfections in the pick and place operation and/or variations in the size, height and position of the solder structures can cause the capacitors to wobble, rotate or otherwise move during the reflow. If the movement is too great, one capacitor can short to another. To avoid this pitfall, conventional capacitor mounting technique follow design rules for minimum spacing of pick and placed capacitors. This places a significant constraint on package substrate design and size. Many package substrates utilize memory interface areas where large numbers of closely spaced conductor traces fan out from a chip mounting areas. Due to packing constraints of conventionally placed capacitors, such memory interface areas typically have overlying capacitors, which makes the task of routing conductor traces challenging.

The disclosed arrangements utilize molded passive component groups. The molded passive component groups can be molded together with much tighter minimum spacing. As a result, for the same size package substrate, more passive components can be mounted and/or mounted outside memory interface areas, or mounted in such a way so that more chips can be mounted than is conventionally possible.

In accordance with one aspect of the present invention, a method of manufacturing is provided that includes at least partially encapsulating a first plurality of capacitors in a molding material to create a first molded passive component group. The first molded passive component group is mounted on a surface of a circuit board. The first plurality of capacitors are electrically connected to the circuit board.

In accordance with another aspect of the present invention, a method of manufacturing is provided that includes fabricating plural molded passive component groups by at least partially encapsulating plural groups of capacitors in a molding material and singulating the molded passive component groups. The molded passive component groups are mounted on a surface of a semiconductor chip package substrate. The capacitors are electrically connected to the semiconductor chip package substrate.

In accordance with another aspect of the present invention, an apparatus is provided that includes a circuit board that has a surface, and at least one molded passive component group mounted on the surface of and electrically connected to the circuit board. The at least one molded passive component group includes a first plurality of capacitors each having an upper surface and a molding material joining together and covering the upper surfaces of the first plurality of capacitors.

Figure 2:
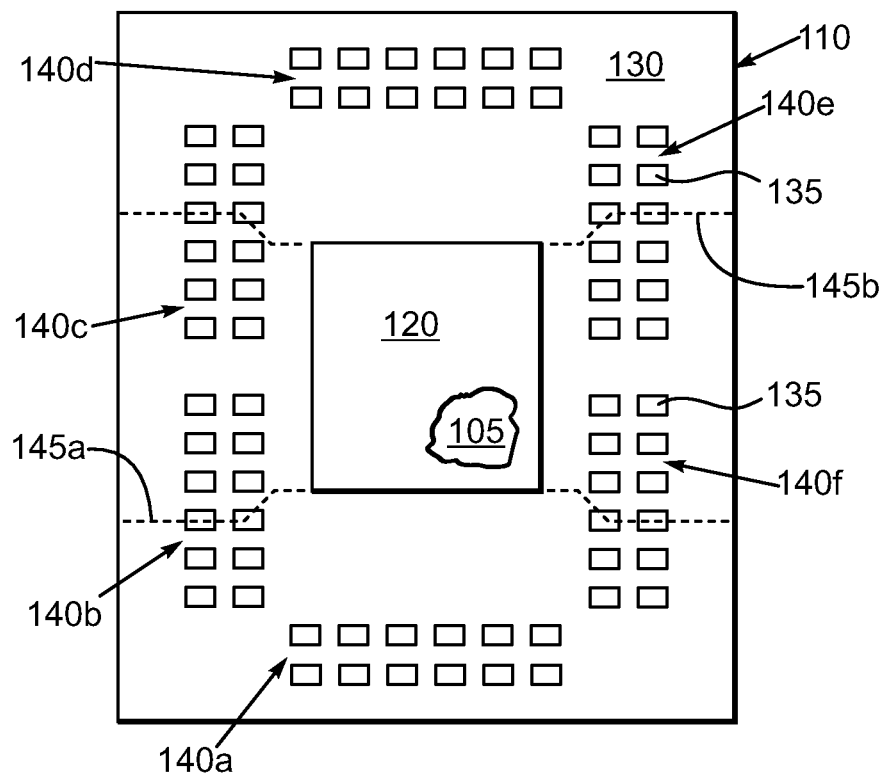
FIG. 2 is a plan view of the exemplary semiconductor chip package substrate.

In the drawings described below, reference numerals are generally repeated where identical elements appear in more than one figure. Turning now to the drawings, and in particular to FIG. 1, therein is depicted a partially exploded pictorial view of an exemplary conventional semiconductor chip package 100 that includes a semiconductor chip 105 mounted on a package substrate 110. A lid 115 is mounted on the package substrate 110 to serve as a heat spreader and is in thermal contact with the semiconductor chip 105 by way of a thermal interface material 120. In this illustrative conventional arrangement, the package substrate 110 is a pin grid array package that includes plural conductor pins 125 that are designed to insert into a pin grid array socket (not shown). The upper surface 130 of the package substrate 120 is populated with plural surface components 135, which are typically capacitors in this conventional arrangement. Additional details of the conventional semiconductor chip package 100 may be understood by referring now also to FIG. 2, which is a plan view of the package substrate 110 but without the lid 115 shown depicted in FIG. 1. A portion of the thermal interface material is cut away to reveal the underlying semiconductor chip 105. The conventional capacitors 135 are mounted on the upper surface 130 of the package substrate 110 as individual items in a pick and place operation. In this illustrative arrangement, there are six capacitor groups 140a, 140b, 140c, 140d, 140e and 140f disposed around the periphery of the semiconductor chip 105. The package substrate 110 includes large numbers of conductor traces that fan out all over the package substrate 110 but are not shown in FIG. 2. Many of these invisible conductor traces are positioned in memory interface regions 145a and 145b (the areas between the dashed lines) of the package substrate 110. There is typically a greater number and higher density of the conductor traces in the memory interface regions 145a and 145b in order to handle the multitudes of signal pathways between the semiconductor chip 105 and external memory devices (not shown). Because of the size and process limitations associated with mounting the conventional capacitors 135, some of the capacitors 135 in, for example the capacitor groups 140b, 140c, 140e and 140f are positioned over the memory interface areas 145a and 145b. This creates a constraint on the ability to route and place the underlying conductor traces.

Figure 3:
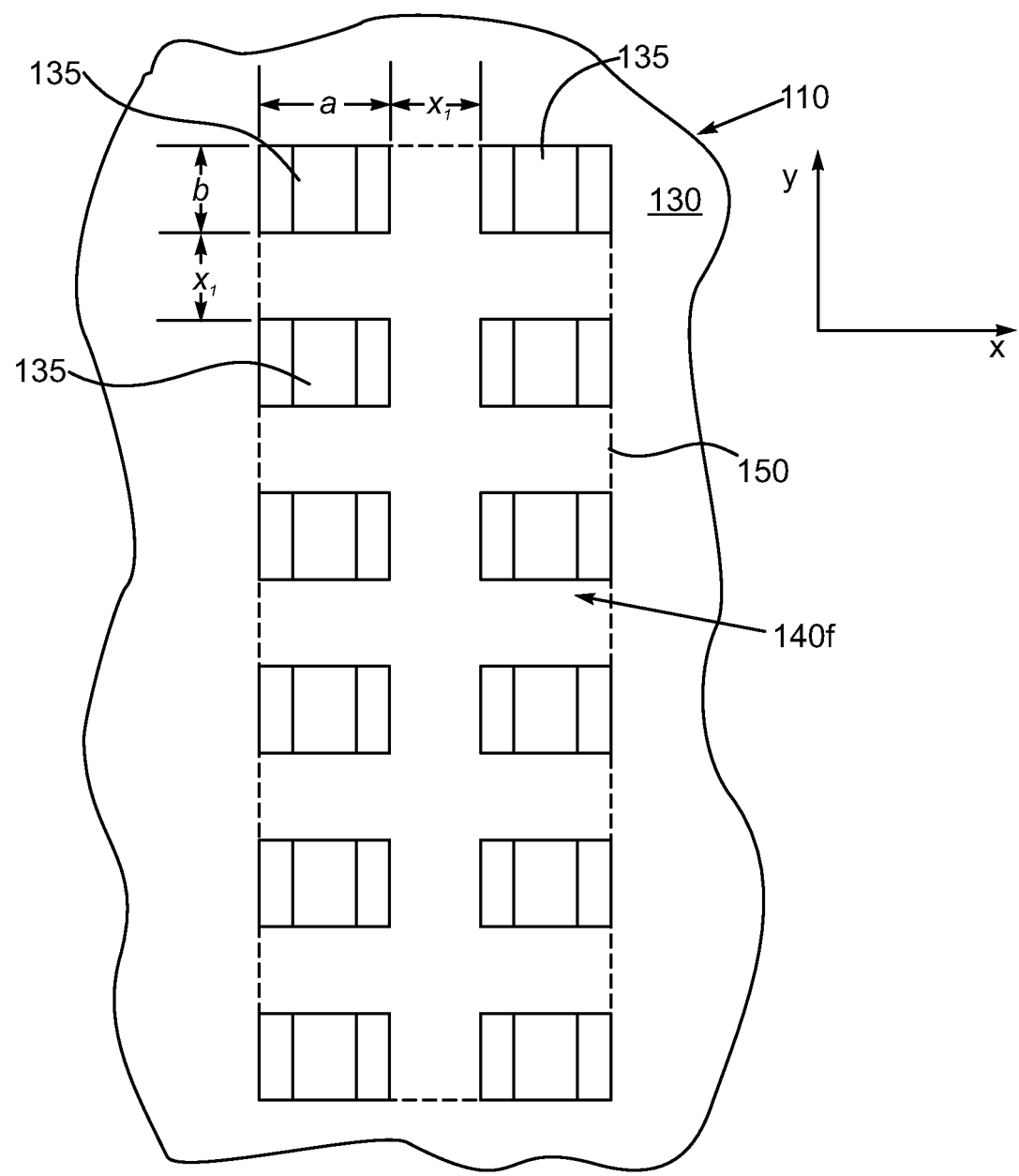
FIG. 3 is a portion of FIG. 2 shown at greater magnification.

Additional details of the conventional package substrate 110 and the capacitor 135 placement thereon can be understood by referring now also to FIG. 3, which is a portion of the package substrate 110 upon which the capacitor group 140f is positioned. As noted above, the capacitors 135 are individually placed on the upper surface 130 of the package substrate 110. A typical conventional capacitor 135 has some length a and a width b. In one conventional arrangement, a is 1.6 mm and b is 0.8 mm. Due to constraints in the conventional process for placing the capacitors 135, design rules call for a minimum spacing $x_1$ along the x-axis between individual capacitors 135 and the same minimum spacing $x_1$ between capacitors along the y-axis. One conventional arrangement specifies a minimum spacing $x_1$ of 0.8 mm. Let r equal the number or rows, c equal the number of columns, and n equal the number of capacitors 135 in the capacitor group 140f. For the capacitor group 140f r=6, c=2 and n=12. Because of the placement constraint, the capacitor group 140f consumes a total surface area A represented by the dashed box 150 and given by:

$$A_1 = abn + x_1 rc(a+b) - x_1(ac+br) + (c-1)(r-1)x_1^2 \qquad (1)$$

Inserting the values a=1.6 mm, b=0.8 mm, $x_1$=0.8 mm, r=6, c=2 and n=12 into Equation (1) yields an area A of the dashed box 150 of 35.2 mm$^2$.

Figure 4:
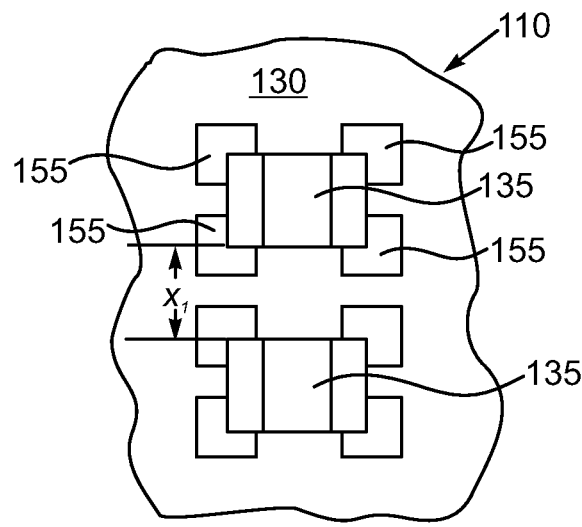
FIG. 4 is a portion of FIG. 2 shown at greater magnification.

FIG. 4 depicts a plan view of two of the capacitors 135. Each of the capacitors 135 is mounted on four solder pads 155 of the conventional package substrate 110, which are located proximate the corners of each capacitor 135. During the pick and place operation, each capacitor 135 is mounted over the solder pads 155 and a reflow process is performed in order to temporarily liquefy the solder pads 155 and thus establish a metallurgical bond with the capacitors 135. Due to the potential for the capacitors 135 to rotate out of alignment during this reflow phase as well as imperfections in the accuracy of the vertical placement of the capacitors 135 relative to the underlying solder pads 155, the conventional design rules require the aforementioned minimum spacing $x_1$=0.8 mm in or to compensate for the propensity for the capacitors to be misaligned and perhaps short out with one another or create other problems.

Figure 5:
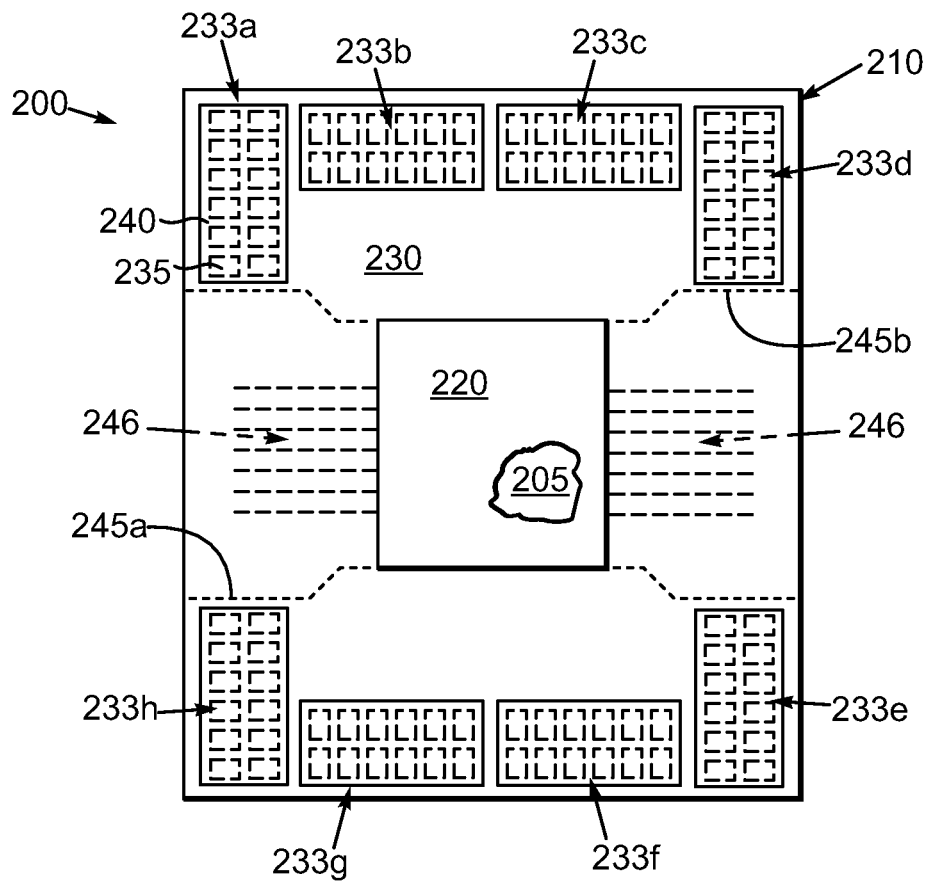
FIG. 5 is a plan view of an exemplary semiconductor package arrangement with exemplary molded passive component groups.

An exemplary new arrangement of a semiconductor chip device 200 is depicted in FIG. 5, which is a plan view depicting a semiconductor chip 205 mounted on a circuit board 210, which can be a semiconductor chip package substrate, a circuit card, a system board or other. The circuit board 210 can an organic build-up design, a multi-layer prepreg design, a ceramic or other design. A thermal interface material 220 of the type depicted in the earlier figures can be placed on the semiconductor chip 205, and is indeed shown partially cut away to reveal the underlying semiconductor chip 205. A lid (not shown) of the type depicted in FIG. 1 or other types can also be used to convey heat away from the semiconductor chip 205. To alleviate the technical issues associated with the conventional placement of the capacitors 135 depicted in FIGS. 1, 2, 3 and 4, the upper surface 230 of the circuit board 210 is populated with plural molded passive component groups 233a, 233b, 233c, 233d, 233e, 233f, 233g and 233h. Each of the molded passive component groups 233a, 233b, 233c, 233d, 233e, 233f, 233g and 233h consists of plural passive components 235 (shown as dashed boxes) molded inside of a molding material 240. The passive components 235 in this illustrative arrangement and the disclosed alternative arrangements can be capacitors, inductors or resistors. As described in more detail below, the passive components 235 are molded inside of the molding material 240 in a process that provides for very tight spacing between the passive components 235 in a given passive component group 233a, 233b, etc. Indeed, whereas the conventional arrangement requires a minimum spacing x of 0.8 mm, the disclosed new arrangements reduce that minimum spacing between passive components 235 to as little as 0.1 mm or perhaps even smaller. This enables a much greater packing density for the passive components 235 in each of the groups 233a, 233b, 233c, 233d, 233e, 233f, 233g and 233h and thus provides more passive components 235 for a given size of circuit board 210 than is conventionally available and also enables the passive component groups 233a, 233b, 233c, 233d, 233e, 233f, 233g and 233h to be positioned outside the memory interface regions 245a and 245b of the circuit board 210, which enables greater flexibility in the number and arrangement of the underlying conductor traces 246 (shown in dashed) in the circuit board 210.

Figure 6:
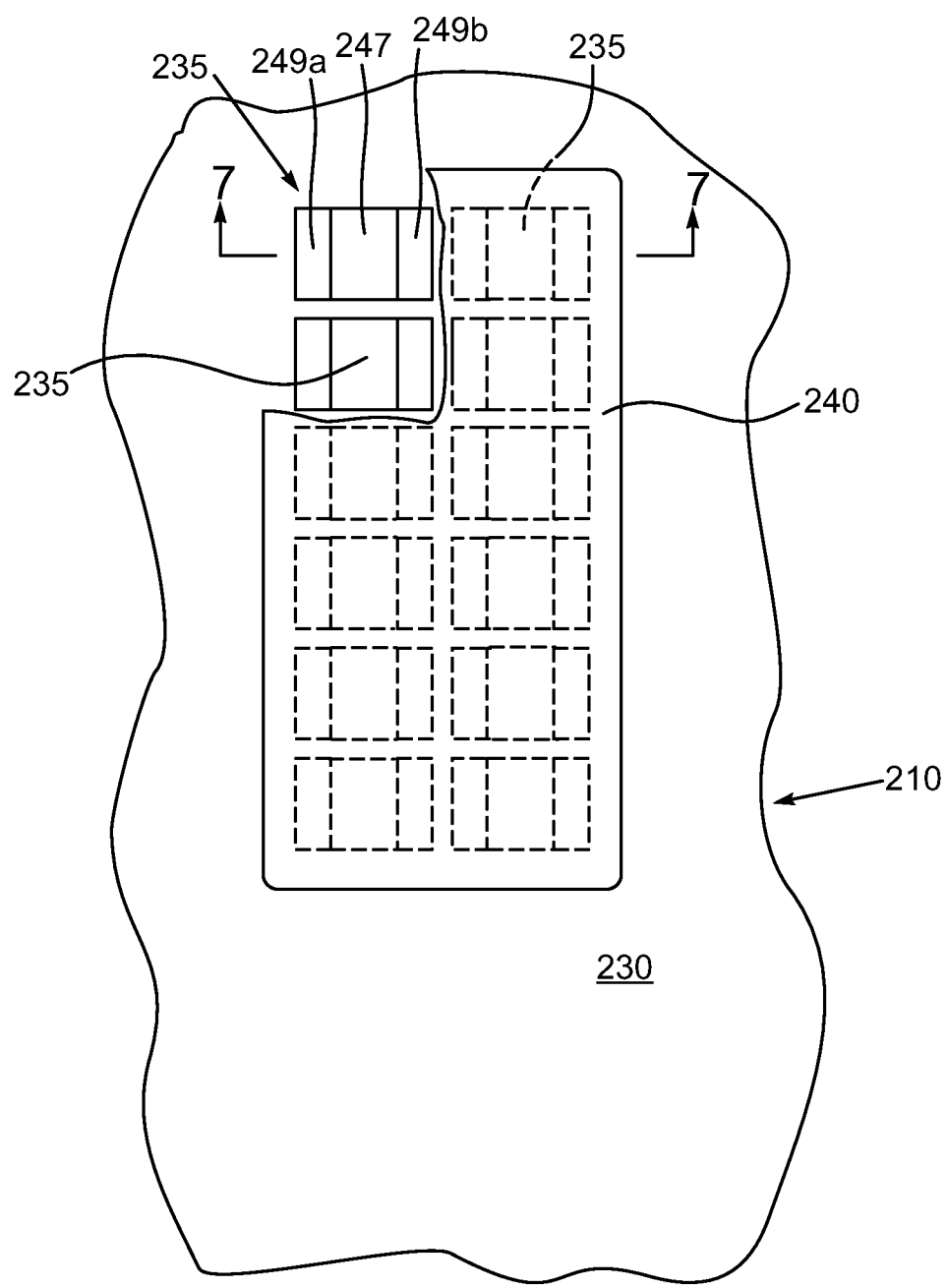
FIG. 6 is a portion of FIG. 5 shown at greater magnification.
Figure 7:
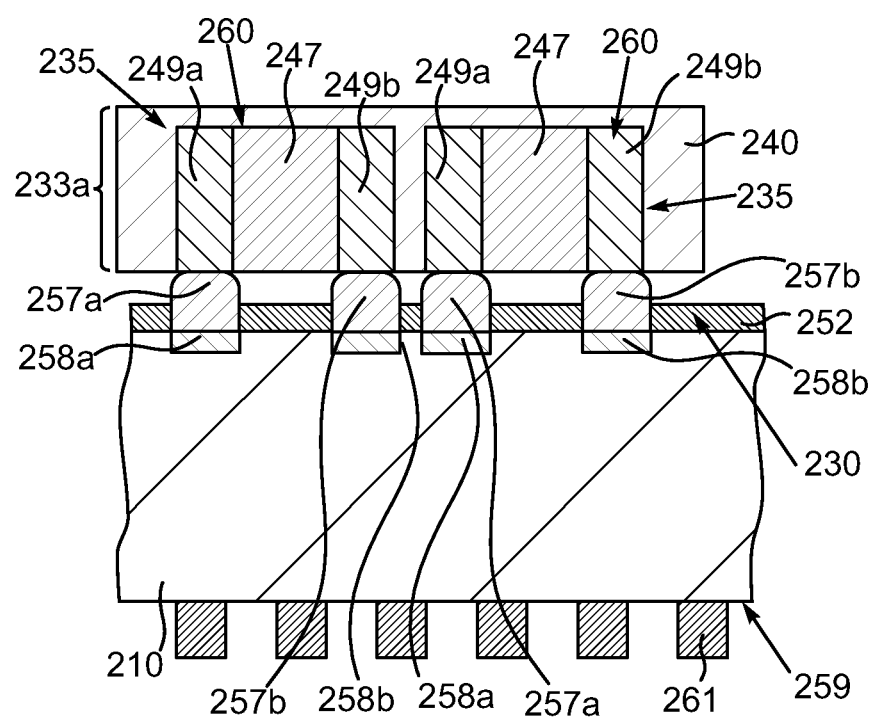
FIG. 7 is a sectional view of FIG. 6 taken at section 7-7.

Additional details of the passive component group 233a may be understood by referring now to FIGS. 6 and 7. FIG. 6 is a plan view of the passive component group 233a and the upper surface 230 of the circuit board 210 shown at greater magnification then in FIG. 5. FIG. 7 is a sectional view of FIG. 6 taken at section 7-7. The following description of the passive component group 233a will be illustrative of the other passive component groups 233b, 233c, 233d, 233e, 233f, 233g and 233h. Turning first to FIG. 6, and as noted above, the passive component group 233a consists of plural passive components 235, at least partially embedded or encapsulated, within the molding material 240, which is shown partially cut away to reveal a couple of the passive components 235. Each of the passive components 235 includes a central insulating coating 247 and end electrodes 249a and 249b. Here, the passive component group 233a includes twelve passive components 235. However, the skilled artisan will appreciate that virtually any number, say two or more, can be aggregated together within the molding material 240.

Attention is now turned to FIG. 7, which as noted above, is a sectional view of FIG. 6 taken at section 7-7. Note that because of the location of section 7-7, a couple of the passive components 235 as well as a portion of the molding material 240 are shown in section. The left hand passive component 235 includes the aforementioned insulating coating 247 and electrodes 249a and 249b, which are in ohmic contact with underlying solder pads 257a and 257b. The right hand passive component 235 similarly has an insulating central region 247 and electrodes 249a and 249b which are connected to respective underlying solder pads 257a and 257b. The passive components 235 can be of virtually any capacitor design, such as multi-plate, single plate, etc., or virtually resistor or inductor design. The solder pads 257a and 257b project downward through openings in a solder mask 252 that is formed on the underlying circuit board 210. The solder pads 257a and 257b are connected to respective underlying metallization pads 258a and 258b. It should be understood that the number of underlying solder pads 257a and 257b for each of the passive components 235 can number more than two and in fact be similar to the solder pads 155 depicted in FIG. 4. Optionally, other numbers such as two or something other than four can be used. As noted above, the molding material 240 at least partially encapsulates the passive components 235 and creates, along with the passive components 235, the aforementioned molded passive component group 233a. It is desirable for the molding 240 to cover the upper surfaces 260 of the passive components 235 so as to protect the passive components 235 from materials that could damage or otherwise electrically short the passive components 235, such as, solder thermal interface materials. However, the molding material 240 is molded or otherwise processed to expose the electrodes 249a and 249b of each of the passive components 235 so that metallurgical bonds can be made with the solder pads 257a and 257b. It should also be understood that any or all of the molded passive component groups 233a, 233b, 233c, 233d, 233e, 233f, 233g and 233h (or any disclosed alternatives) can mounted on the surface 230 of the circuit board 210 or the opposite surface 259 of the circuit board 210 or any disclosed alternatives. Here, the circuit board 210 is a land grid array design with plural lands 261. Alternative arrangements can use pin grid arrays, ball grid arrays, others I/Os or no I/Os.

Figure 8:
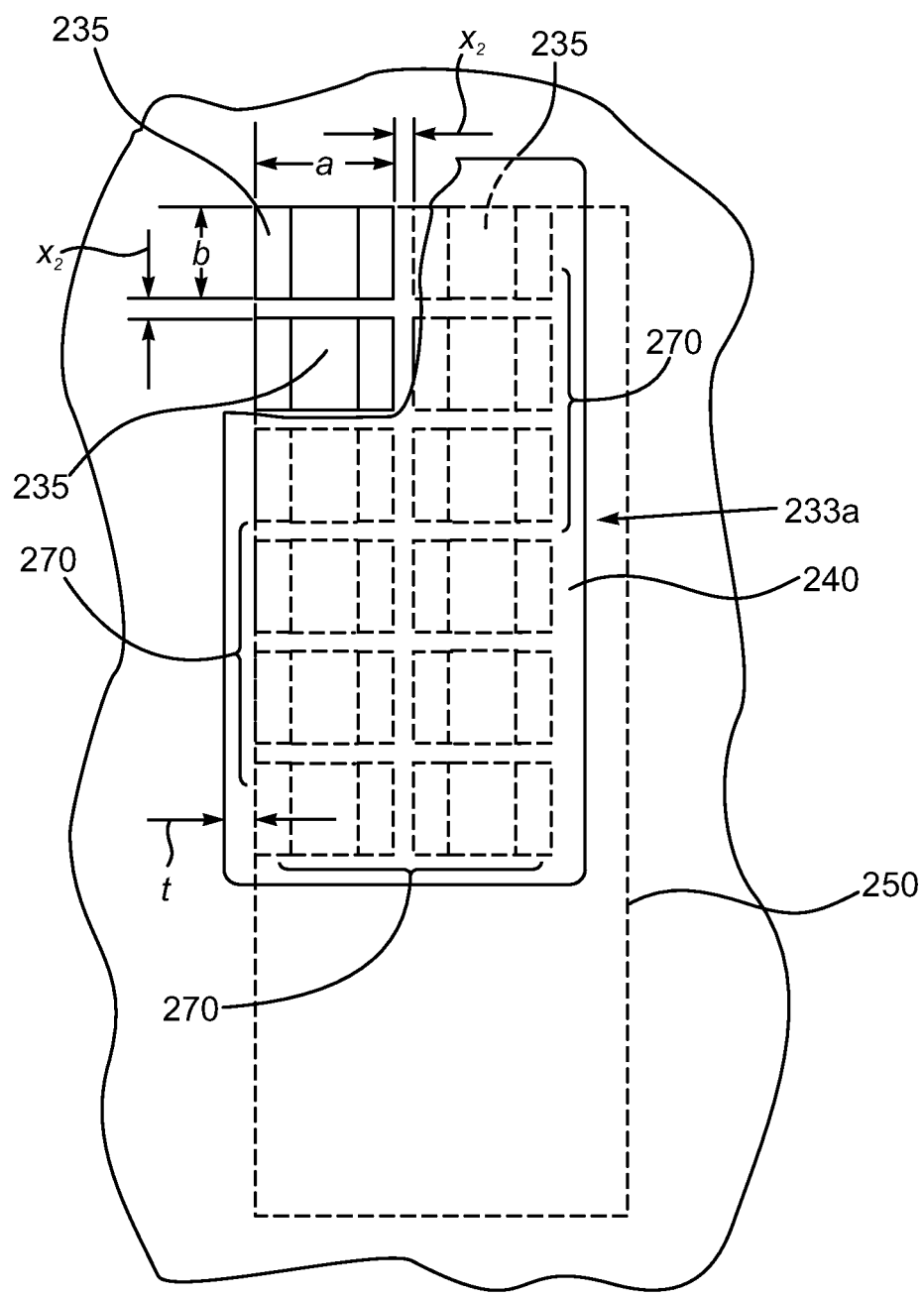
FIG. 8 is the portion depicted in FIG. 6 with a portion of the molding cut away.

Additional details regarding the geometry of the molded passive component group 233a will be described now in conjunction with FIG. 8, which is a plan view like FIG. 3 of the conventional capacitor group 140f but which clearly shows some of the important differences to be described now. The passive components 235 can have the same length $a_1$ and width $b_1$ as the capacitors 135 depicted in the earlier figures and described above or other lengths and widths. However, because of a different processing technique to be described in more detail below, the passive components 235 can be molded within the molding material 240 with a minimum spacing x, which as noted above, can be a fraction of the conventional minimum spacing x described above. Note that the conventional area 150 of the conventional capacitor grouping 140f depicted in FIG. 3 is superimposed in FIG. 8 around the new molded passive component group 233a. Because of the minimum spacing $x_2$, where $x_2 < x_1$, the passive component group 233a takes up only a fraction of the area 150 of the conventional design. The area $A_2$ is given by:

$$A_1 = abn + x_2 rc(a+b) - x_2(ac+br) + (c-1)(r-1)x_2^2 \qquad (2)$$

Equation (2) is obtained by modifying Equation (1) by substituting $x_2$ for $x_1$. Assume for the sake of comparison that r=6, c=2, n=12, a=1.6 mm, b=0.8 mm and $x_2$=0.1 mm for the passive component group 233a. Inserting those values into Equation (2) yields an area $A_2$ of passive component group 233a of 17.49 mm$^2$, which is a significant reduction over the conventional $A_1$ of 35.2 mm$^2$.

The area occupied by the external border region 270 of the molding 240 can be included in the total area occupied by the molded passive component group 233a. That area $A_{border}$ of the border region 270 is given by:

$$A_{border} = [ac + (c-1)(x_2)][x_2 - d] + [br + x_2(r-1)(x_2 - d)] \qquad (3)$$

where d is the dicing kerf width of the cutting blade used to singulate the molded passive groups. Typical values for d are 0.040 to 0.050 mm. It is anticipated that the width t of the border 270 (and given by $t = 2(x_2 - d)$) can be quite small, on the order of 0.11 mm (for a mid-range value of 0.045 mm for d) or smaller if desired. It should be understood that the width t will depend on the accuracy and technique used for singulation discussed below. Inserting the values d=0.045 mm, a=1.6 mm, b=0.8 mm, $x_2$=0.1 mm, c=2 and r=6 into Equation (3) yields an area $A_{border}$ of 4.789 mm$^2$. So the total area occupied by the passive component group 233a is $A_2 \pm A_{border}$ or 22.28 mm$^2$. Now it should be understood the passive component groups 233a, 233b, 233c, 233d, 233e, 233f, 233g and 233h can number other than eight and can have different numbers of passive components 235. One group might have 2 and another have 6 and so on. Equations (2) and (3) are valid for symmetric arrangements of the passive components 235, that is, the same numbers of passive components in each column, and equal spacings between components 235 and a symmetric border region 270. Of course the areas $A_2$ and $A_{border}$ can be readily calculated for asymmetrical arrangements.

Figure 9:
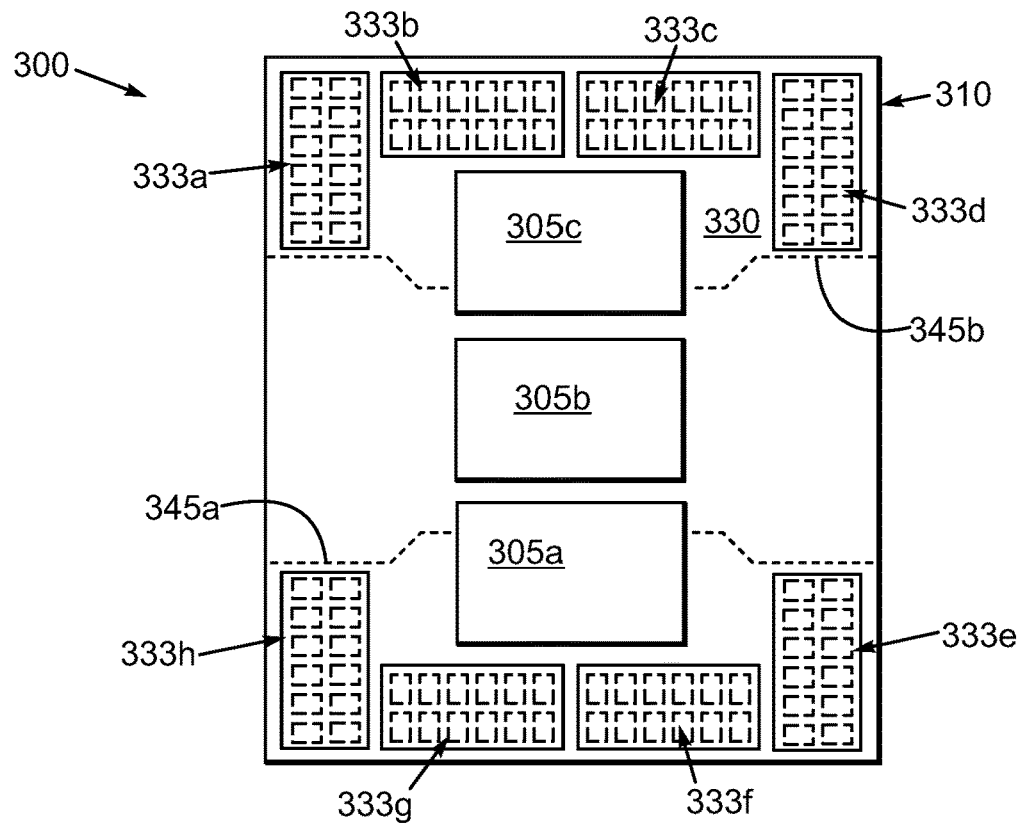
FIG. 9 is a plan view of an alternate exemplary semiconductor package arrangement with exemplary molded passive component groups.

By utilizing molded passive component groups with their attendant smaller footprints, a variety of benefits can be realized. FIG. 9, for example, is a plan view of an alternate exemplary arrangement of a semiconductor chip device 300 that includes plural semiconductor chips 305a, 305b and 305c mounted on a circuit board 310 and in particular the upper surface 330 thereof. The circuit board 310 can be configured like the circuit board 210 disclosed elsewhere herein. Here, eight molded passive component groups 333a, 333b, 333c, 333d, 333e, 333f, 333g and 333h are mounted on the upper surface 330 of the circuit board 310. But because the passive component groups 333a are proportionally much smaller than that permitted by the conventional design, for example, the capacitor group 140f depicted above, additional surface area of the circuit board 310 is available to position not one, but three semiconductor chips 305a, 305b and 305c of similar size, without having to position any of the passive component groups 333a, 333b, 333c, 333d, 333e, 333f, 333g and 333h within the confines of the memory interface areas 345a and 345b. In other words, with approximately the same footprint of circuit board 310 as the conventional design of the package substrate 110, more passive components 335 of the groups 333a, 333b, 333c, 333d, 333e, 333f, 333g and 333h can be positioned on the circuit board 310 while accommodating more and/or bigger semiconductor chips without necessarily constraining the routing of traces in the memory interface areas 345a and 345b.

Figure 10:
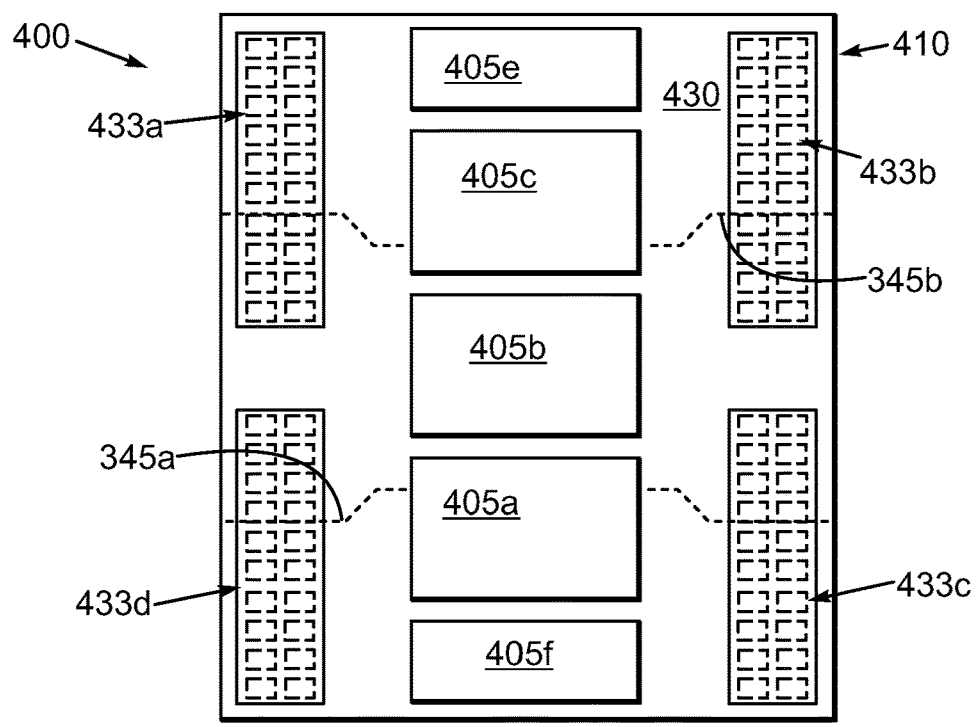
FIG. 10 is a plan view of an alternate exemplary semiconductor package arrangement with exemplary molded passive component groups.

In yet another alternate exemplary arrangement, a semiconductor chip package 400, depicted in a plan view in FIG. 10, includes semiconductor chips 405a, 405b, 405c, 405d and 405e mounted on a circuit board 410 and in particular on the upper surface 430 thereof. The circuit board 410 can be configured like the circuit boards 210 and 310 disclosed elsewhere herein. Here, plural molded passive component groups 433a, 433b, 433c and 433d are mounted on the upper surface 430 on either side of the chips 405a, 405b, 405c, 405d and 405e. However, because the passive component groups 433a, 433b, 433c and 433d are fabricated using the techniques to be described below, the portions of the upper surface 430 of the circuit board 410 proximate where the chips 405d and 405e, respectively, are mounted is freed up for chip placement as opposed to surface component placement. Here, some portions of the passive component groups 433a, 433b, 433c and 433d can be positioned over the memory interface areas 345a and 345b, but this spatial arrangement is compensated by the ability to add additional semiconductor in the form of the chips 405d and 405e on the circuit board 410.

Figure 11:
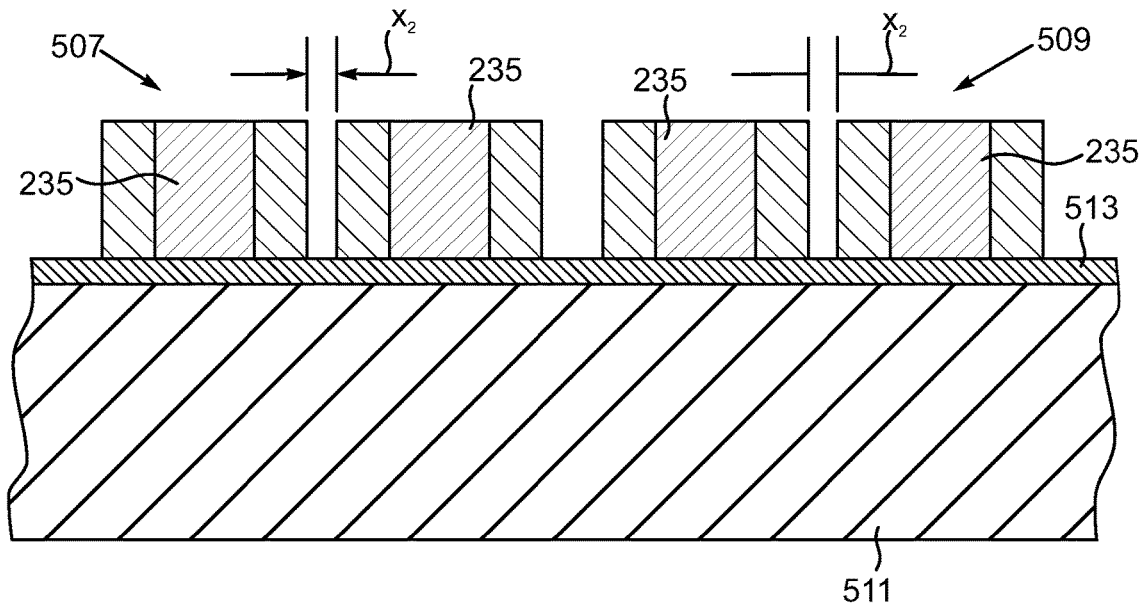
FIG. 11 is a sectional view depicting an exemplary arrangement of passive component groups on a carrier substrate.
Figure 12:
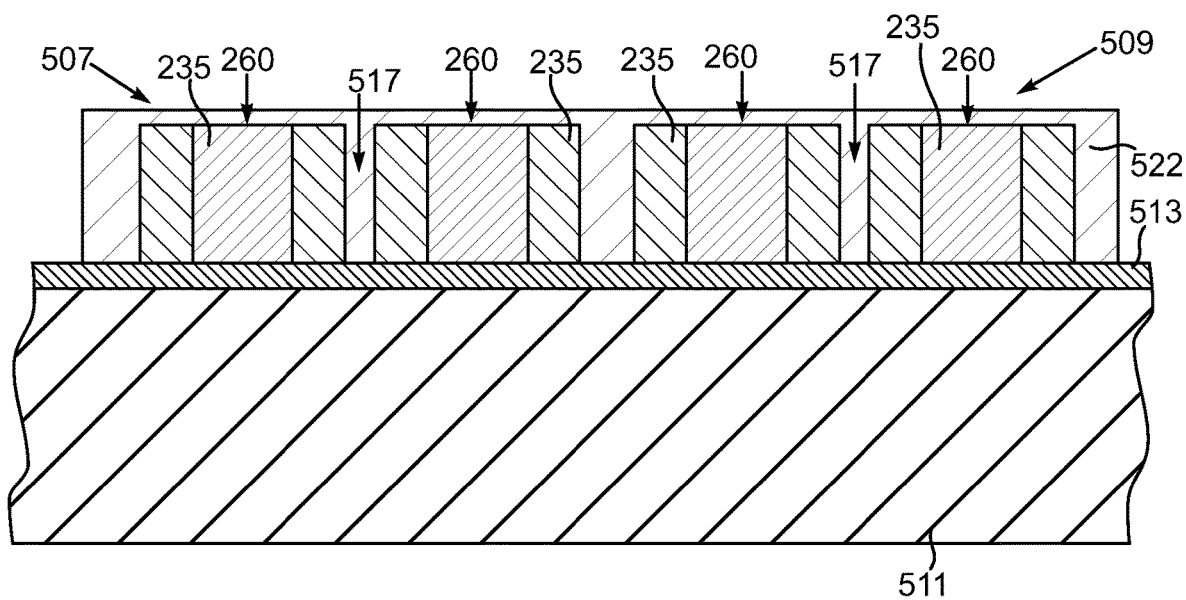
FIG. 12 is a sectional view like FIG. 11, but depicting exemplary molding to at least partially encapsulate the passive components.

An exemplary method for fabricating the molded passive component groups of any of the disclosed arrangements can be understood by referring now to FIGS. 11, 12, 13, 14 and 15 and initially to FIG. 11. Initially one group 507 of passive components 235 and one or more other groups 509 of passive components 235 are removably mounted on a carrier substrate 511. This can be done using the depicted carrier tape 513 positioned on the carrier substrate 511 or by other removable techniques, such as light or heat activated adhesives or others. This processing can performed on wafer scale basis, so there can be scores or more passive component groups 507, 509, etc. The carrier substrate 511 can be a carrier wafer or other workpiece composed of glass, silicon or other materials. The passive components 235 of the group 507 can be, for example, the passive components 235 of the ultimately molded passive component group 233a depicted in FIG. 5 and the passive components 235 of the passive component group 509 can be, for example, passive components 235 of the ultimately molded passive component group 233h also depicted in FIG. 5. The passive components 235 of the group 507 are positioned on the carrier tape 513 with the minimum spacing $x_2$ and the passive components 235 of the group 509 are similarly mounted on the carrier tape 513 with the minimum spacing $x_2$. This tight spacing is permitted by the wafer level process. Next, and as shown in FIG. 12, the passive components 235 of the groups 507 and 509 are subjected to a molding process to create a molding material 522. The molding material 522 covers the uncovered portions of the carrier tape 513 and fills the gaps 517 between the passive components 235 of each of the groups 507 and 509, as well as the gaps between passive components that are spaced in and out of the page of each of the groups 507 and 509. In addition, the molding 522 is performed so that the upper surfaces 260 of each of the passive components 235 is covered. The molding material 522 will, through a subsequent singulation process, be broken out into the individual moldings 240 and passive component groups 233a, 233h, etc., depicted in FIG. 5. The molding material 522 can be composed of well-known molding compounds, such as Sumitomo EME-G750 or G760 or other molding materials, and compression molded at about 165° C. for about 60 to 120 minutes. The carrier wafer 511 remains as a supportive structure for these processes.

Figure 13:
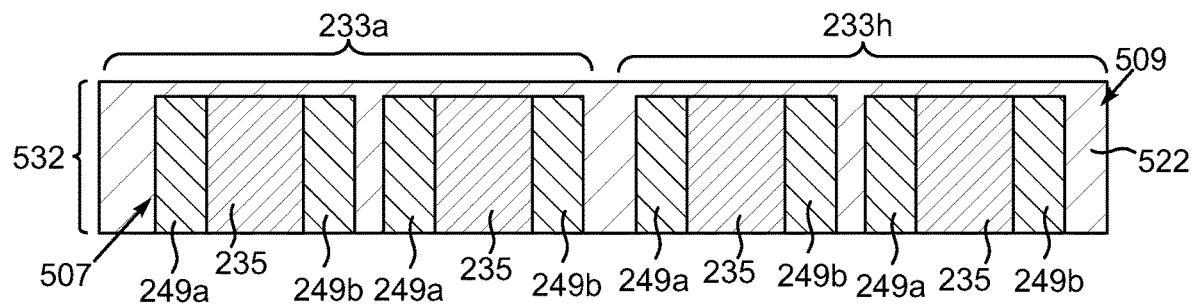
FIG. 13 is a sectional view like FIG. 12, but depicting removal of the carrier substrate.
Figure 14:
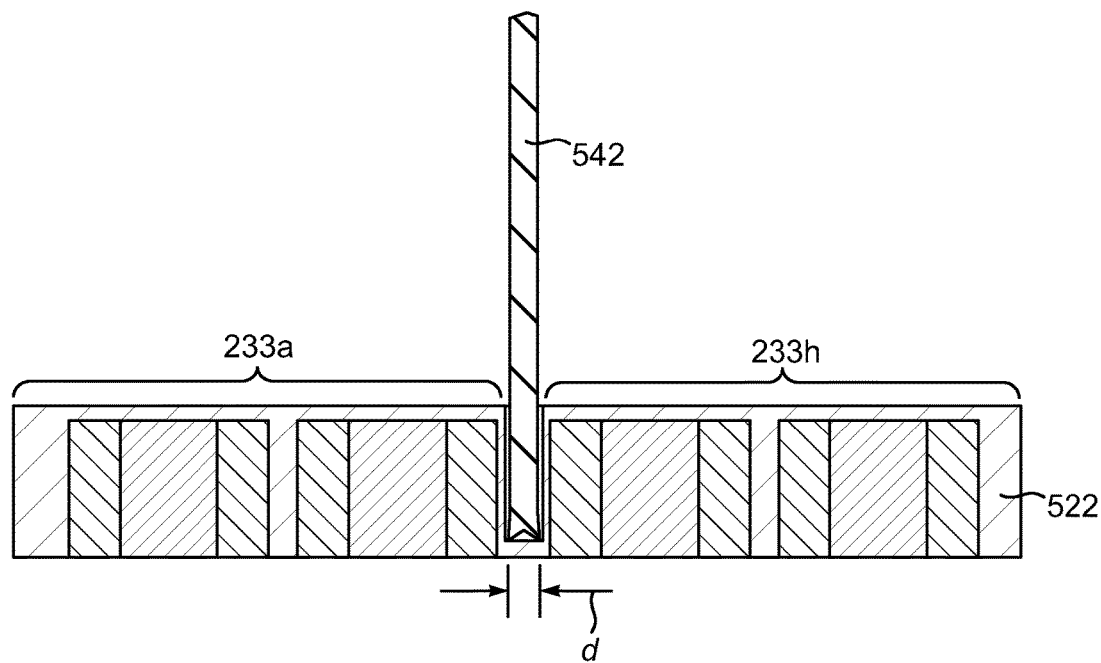
FIG. 14 is a sectional view like FIG. 13, but depicting exemplary singulation of molded passive component groups.
Figure 15:
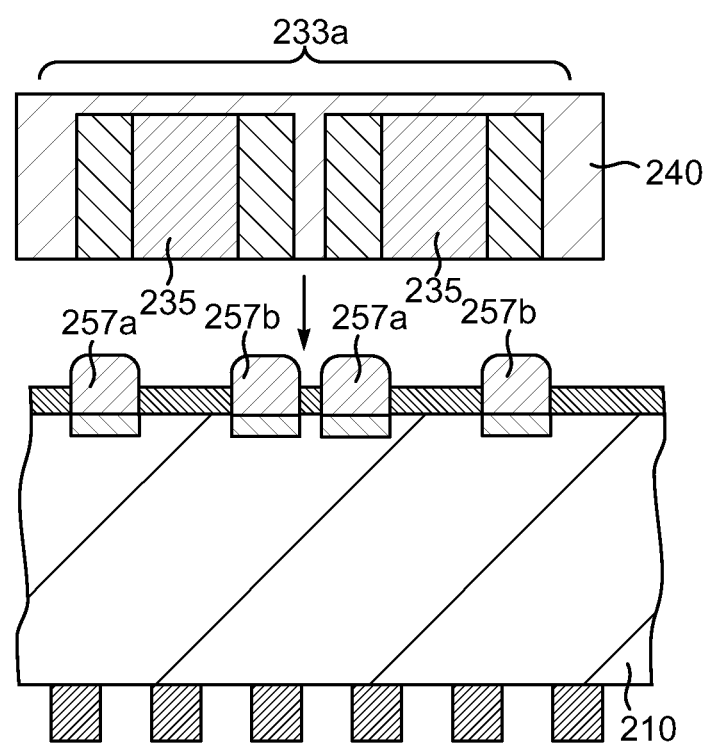
FIG. 15 is a sectional view depicting exemplary mounting of a molded passive component group on a circuit board.

Next and as shown in FIG. 13, the carrier substrate 511 and the carrier tape 513 are removed to leave a reconstituted combination 532 of the molded passive component groups 233a and 233h, which consist of the passive components 235 of the passive component groups 507 and 509, respectively, at least partially encased by the molding 522. If any of the molding 522 covers the lower sides of the electrodes 249a and 249b of the passive components 235, then a suitable grinding or other material removal process should be performed at this stage to ensure that solder will readily wet to the electrodes during substrate mounting. At this point, it is desirable to singulate the molded passive component group 233a from the molded passive component group 233h as shown in FIG. 14 by way of a suitable dicing saw 542 to cut the molding 522 or by other techniques. The dicing saw 542 will have some kerf d, which at least partially determines the thickness t of the molding border 270 depicted in FIG. 8 and discussed above. Following singulation, the molded passive component groups, for example, the passive component group 233a including the passive components 235 and molding 240 shown in FIG. 15, can be mounted on the underlying solder pads 257a and 257b of the circuit board 210 to establish requisite metallurgical connections with the passive components 235 of the molded passive component group 233a and so on for the other passive component groups 233b, 233c, 233d, 233e, 233f, 233g and 233h (see FIG. 5). Next, a suitable reflow can be performed in order to temporarily liquefy the solder interconnect pads 257a and 257b followed by a cool down to create the metallurgical bonds with the circuit board 210.

Figure 16:
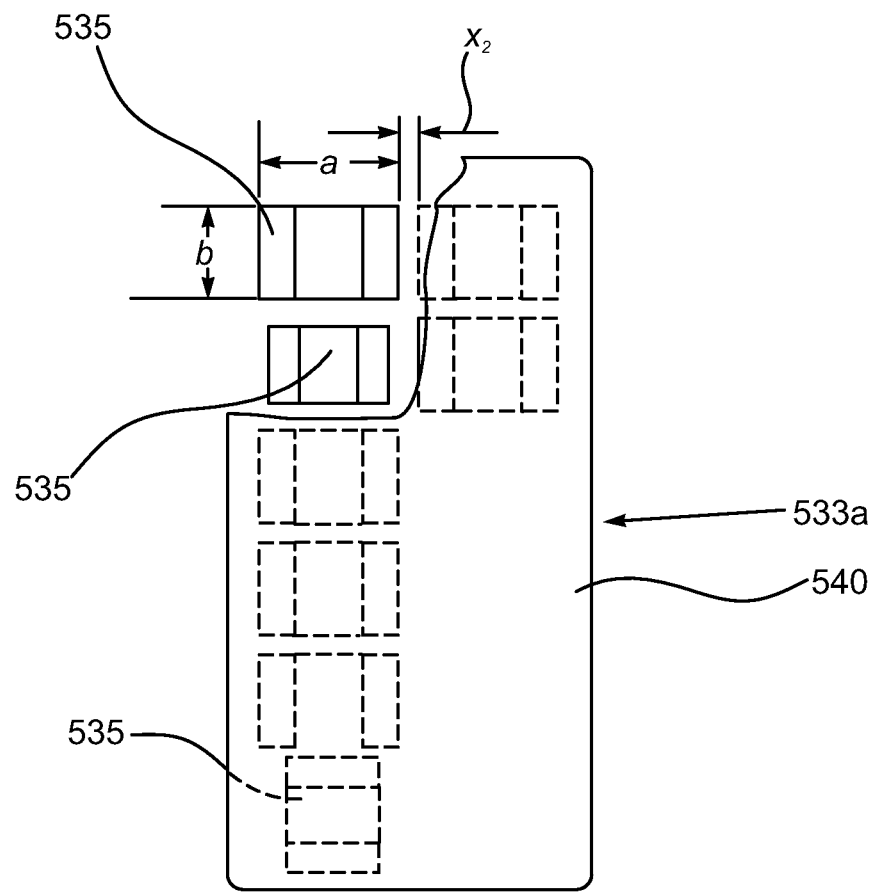
FIG. 16 is a plan view of an alternate exemplary molding passive component group.

As noted above, molded passive components groups can be symmetric or asymmetric. FIG. 16 is a plan view like FIG. 8, but depicting an alternate exemplary arrangement of a molded passive component group 533a that includes passive components 535 in a molding material 540. Various asymmetries are shown. For example, the left-hand column includes six passive components 535 while the right-hand column includes only two passive components 535. The upper left-hand passive component has some dimensions a and b, while the next lower passive component 535 has a smaller footprint. The lowermost left-hand passive component 535 is rotated relative to the other passive components 535. These represent just a few possible variations.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:
1. A method of manufacturing, comprising:
at least partially encapsulating a first plurality of passive components in a molding material to create a first molded passive component group;

molding a portion of the molding material to expose electrodes of the first plurality of passive components; and mounting the first molded passive component group on a surface of a circuit board outside of a memory interface region of the circuit board, the memory interface region including plural conductor traces, and electrically connecting the first plurality of passive components to the circuit board.

2. The method of claim 1, comprising mounting at least one semiconductor chip on the surface of the circuit board.

3. The method of claim 1, wherein the exposing of the electrodes of the first plurality of passive components is performed prior to mounting on the circuit board.

4. The method of claim 1, comprising at least partially encapsulating a second plurality of passive components in the molding material to create a second molded passive component group.

5. The method of claim 4, comprising singulating the first molded passive component group from the second molding passive component group.

6. The method of claim 1, wherein the at least partially encapsulating comprises removably mounting the first plurality of passive components on a carrier substrate, molding the first plurality of passive components and removing the carrier substrate.

7. The method of claim 6, wherein the removably mounting comprises mounting the first plurality of passive components on a carrier tape positioned on the carrier substrate.

8. The method of claim 1, wherein the at least partially encapsulating comprises compression molding.

9. A method of manufacturing, comprising:
fabricating plural molded passive component groups by at least partially encapsulating plural groups of passive components in a molding material and singulating the molded passive component groups;
molding a portion of the molding material to expose electrodes of the passive components; and
mounting the molded passive component groups on a surface of a circuit board outside of a memory interface region of the circuit board, the memory interface region including plural conductor traces, and electrically connecting the passive components to the circuit board.

10. The method of claim 9, comprising mounting at least one semiconductor chip on the surface of the circuit board.

11. The method of claim 9, comprising wherein the exposing of the electrodes of the passive components is performed prior to mounting on the circuit board.

12. The method of claim 9, wherein the at least partially encapsulating comprises removably mounting the groups of passive components on a carrier substrate, molding the groups of passive components and removing the carrier substrate.

13. The method of claim 12, wherein the removably mounting comprises mounting the first plurality of passive components on a carrier tape positioned on the carrier substrate.

14. The method of claim 1, wherein the circuit board is a semiconductor chip package substrate.

15. The method of claim 1, wherein the first molded passive component group consists of only passive components.

16. The method of claim 1, wherein a semiconductor chip is mounted to the circuit board prior to mounting the first molded passive component group on the circuit board.

17. The method of claim 9, wherein the circuit board is a semiconductor chip package substrate.

18. The method of claim 9, wherein each of the plural molded passive component groups consists of only passive components.

19. The method of claim 9, wherein a semiconductor chip is mounted to the circuit board prior to mounting the molded passive component groups on the circuit board.

* * * * *